(12) United States Patent
Lee et al.

(10) Patent No.: US 12,548,876 B2
(45) Date of Patent: Feb. 10, 2026

(54) ELECTROMAGNETIC WAVE TRANSCEIVER

(71) Applicant: HL Klemove Corp., Incheon (KR)

(72) Inventors: Seong-Wook Lee, Seoul (KR);
Hyun-Yong Lee, Bucheon-si (KR);
Seok-Jin Kim, Incheon (KR);
Seung-Hun Lee, Incheon (KR);
Dong-Wook Park, Incheon (KR)

(73) Assignee: HL KLEMOVE CORP., Incheon (KR)

( * ) Notice: Subject to any disclaimer, the term of this patent is extended or adjusted under 35 U.S.C. 154(b) by 314 days.

(21) Appl. No.: 18/125,951

(22) Filed: Mar. 24, 2023

(65) Prior Publication Data
US 2023/0327311 A1  Oct. 12, 2023

(30) Foreign Application Priority Data

Mar. 24, 2022 (KR) .................. 10-2022-0036912
Dec. 13, 2022 (KR) .................. 10-2022-0174038

(51) Int. Cl.
*H01Q 1/12* (2006.01)
*H01P 3/12* (2006.01)
*H05K 1/02* (2006.01)

(52) U.S. Cl.
CPC .............. *H01P 3/121* (2013.01); *H01Q 1/12* (2013.01); *H05K 1/0237* (2013.01); *H05K 2201/10098* (2013.01)

(58) Field of Classification Search
CPC ... H05K 2201/09985; H05K 2201/041; H05K 1/144; H05K 7/026; H05K 5/0069; H05K 2201/10515
See application file for complete search history.

(56) References Cited

U.S. PATENT DOCUMENTS

| | | | |
|---|---|---|---|
| 12,288,927 B2* | 4/2025 | Vincent | H01Q 21/064 |
| 2003/0027530 A1 | 2/2003 | Levitt et al. | |
| 2005/0047100 A1* | 3/2005 | Kim | H05K 7/142 |
| | | | 361/758 |
| 2016/0169259 A1* | 6/2016 | Burleson | H05K 1/18 |
| | | | 411/510 |
| 2020/0343612 A1 | 10/2020 | Shi | |
| 2022/0057703 A1 | 2/2022 | Tsai et al. | |
| 2023/0395980 A1* | 12/2023 | Park | H01Q 13/06 |

FOREIGN PATENT DOCUMENTS

| JP | 2002-022822 A | 1/2002 |
|---|---|---|
| JP | 6537943 B2 | 7/2019 |
| KR | 20-1994-0000599 Y1 | 2/1994 |
| KR | 10-2003-0031585 A | 4/2003 |

OTHER PUBLICATIONS

Korean Office Action issued on Dec. 10, 2024, in connection with the corresponding Korean Patent Application No. 10-2022-0174038, 12 pages, along with an English machine translation.

* cited by examiner

*Primary Examiner* — Dameon E Levi
*Assistant Examiner* — David Andrew Kubera
(74) *Attorney, Agent, or Firm* — Hauptman Ham, LLP

(57) ABSTRACT

An electromagnetic wave transceiver according to an embodiment includes a waveguide assembly including an assembly fastening hole, a circuit board including a board fastening hole and disposed to be stacked on the waveguide assembly, and a fastener interference-fitted or transition-fitted into the assembly fastening hole and the board fastening hole to couple the waveguide assembly and the circuit board.

8 Claims, 10 Drawing Sheets

ELECTROMAGNETIC WAVE TRANSCEIVER

CROSS-REFERENCE TO RELATED APPLICATION

This application claims the benefit of Korean Patent Application No. 10-2022-0036912, filed on Mar. 24, 2022 in the Korean Intellectual Property Office, the disclosure of which is incorporated herein by reference.

BACKGROUND

1. Field

Embodiments of the present disclosure relate to an electromagnetic wave transceiver, and more specifically, to an electromagnetic wave transceiver of which a weight is reduced and process efficiency is improved by improving a coupling assembly between a circuit board and a waveguide assembly stacked on the circuit board.

2. Description of the Related Art

In vehicles, various electromagnetic wave transceivers such as radar sensors including circuit boards and waveguide assemblies stacked on the circuit boards are used in electric vehicles to detect traffic environments in conjunction with driver assistance or safety systems such as acoustic vehicle alert sound (AVAS) systems as well as electronic distance adjustment systems and collision warning systems.

In general, such an electromagnetic wave transceiver includes an antenna which transmits and receives electromagnetic waves to and from an external space, a circuit board on which elements such as electronic components for driving the antenna are mounted, and a waveguide provided between the antenna and the circuit board and used for a path to minimize loss of the electromagnetic waves. In the electromagnetic wave transceiver, a layout and fixation of the components are required for accurate and smooth signal transmission between the components.

Conventionally, in such an electromagnetic wave transceiver, since fasteners such as a screw and a nut or rivet coupled to the screw are used to fix a waveguide assembly and a circuit board which are disposed to be stacked, a weight of a product increases, man hours increase due to a fastening process of the fasteners, and thus there is a problem of lowering process efficiency.

In particular, the conventional electromagnetic wave transceiver has a problem of reducing a space for components and patterns to be mounted on the circuit board because a head, a nut, and the like for preventing separation of the fasteners occupy a relatively large area.

As a way to address the problems, a method of coupling a circuit board and a waveguide assembly disposed to be stacked on the circuit board using a conductive adhesive without a separate fastener is partially applied.

However, in an electromagnetic wave transceiver such as a vehicle radar sensor that is relatively frequently exposed to external forces such as vibrations and impacts, when a method of coupling a circuit board and a waveguide assembly using only a conductive adhesive is applied, there is a problem that the performance is lowered, or a product is damaged because alignment and fixation between components are changed by an insufficient fastening force when compared to a coupling assembly using fasteners.

SUMMARY

Therefore, it is an aspect of the present disclosure to provide an electromagnetic wave transceiver in which an increase in weight of a product due to a fastener is minimized.

It is another aspect of the present disclosure to provide an electromagnetic wave transceiver in which an increase in process cost and a decrease in process efficiency due to a fastening process of a fastener are minimized.

It is still another aspect of the present disclosure to provide an electromagnetic wave transceiver in which a decrease in space for an element, a circuit, and the like to be mounted on a circuit board due to a head and the like of a fastener is minimized.

It is yet another aspect of the present disclosure to provide an electromagnetic wave transceiver in which the reliability of a product is further improved by accurately and firmly fixing components even when applied to various products including radar sensors and the like which are relatively frequently exposed to external forces such as vibrations and impacts.

It is yet another aspect of the present disclosure to provide an electromagnetic wave transceiver in which a misassembly of a waveguide assembly and a circuit board which are disposed to be stacked is prevented.

In accordance with one aspect of the present disclosure, an electromagnetic wave transceiver includes a waveguide assembly including an assembly fastening hole, a circuit board including a board fastening hole and disposed to be stacked on the waveguide assembly, and a fastener interference-fitted or transition-fitted into the assembly fastening hole and the board fastening hole to couple the waveguide assembly and the circuit board.

The waveguide assembly may include an antenna and a waveguide disposed between the antenna and the circuit board.

The electromagnetic wave transceiver may include an adhesive layer formed of a conductive silicone adhesive between the antenna and the waveguide or between the waveguide and the circuit board.

The fastener may include an entry portion having a chamfered shape at an end of the fastener that enters the assembly fastening hole or the board fastening hole.

The fastener may be provided in a tapered shape of which a cross-sectional area decreases toward the entry portion.

The fastener may include a flange protruding in a radial direction on an end portion opposite to an end portion that enters the assembly fastening hole or the board fastening hole.

The flange may be provided so that a height of the fastener is adjustable in a longitudinal direction of the fastener.

The flange may include a first flange that is fixed to a housing and a second flange provided so that a height of the fastener is adjustable in a longitudinal direction of the fastener from the first flange.

The fastener may be integrally formed with a housing disposed to surround the waveguide assembly or at least a part of the circuit board.

In accordance with another aspect of the present disclosure, an electromagnetic wave transceiver includes a waveguide assembly, a circuit board including a board fastening hole and disposed to be stacked on the waveguide assembly, and a fastening boss disposed on the waveguide assembly to be interference-fitted or transition-fitted into the board fastening hole to couple the waveguide assembly and the circuit board.

The waveguide assembly may include an antenna and a waveguide, and the fastening boss may be disposed on the antenna and may pass through an assembly fastening hole provided in the waveguide to be coupled to the board fastening hole.

The electromagnetic wave transceiver may include an adhesive layer formed of a conductive silicone adhesive between the antenna and the waveguide or between the waveguide and the circuit board.

The fastening boss may be provided in a tapered shape of which a cross-sectional area decreases toward an end portion that enters the board fastening hole.

In the fastening boss, a plurality of press fitting ribs protruding from a circumferential surface of the fastening boss in a radial direction may extend in a longitudinal direction of the fastening boss, and a diameter of the fastening boss excluding the press fitting ribs may be smaller than a diameter of the board fastening hole so that the fastening boss is coupled to the board fastening hole when the press fitting ribs are deformed.

The fastening boss may be provided as two or more types having different cross-sectional shapes.

In accordance with still another aspect of the present disclosure, an electromagnetic wave transceiver includes a waveguide assembly and a circuit board including a board fastening hole and disposed to be stacked on the waveguide assembly, wherein the waveguide assembly includes an antenna including an assembly fastening hole and a waveguide having a first fastening part disposed on one surface of the waveguide and interference-fitted or transition-fitted into the assembly fastening hole and a second fastening part disposed on the other surface and interference-fitted or transition-fitted into the board fastening hole, and disposed between the antenna and the circuit board to be coupled to the antenna and the circuit board.

Each of the first fastening part and the second fastening part may be provided in a tapered shape of which a cross-sectional area decreases toward an end portion that enters the assembly fastening hole or the board fastening hole.

In each of the first fastening part and the second fastening part, a plurality of protruding ribs protruding in a radial direction may extend in a longitudinal direction, and a diameter of each of the first fastening part and the second fastening part excluding the protruding ribs may be smaller than a diameter of the assembly fastening hole or the board fastening hole so that the first fastening part and the second fastening part are coupled to the assembly fastening hole and the board fastening hole, respectively, when the protruding ribs are deformed.

Each of the first fastening part and the second fastening part may be provided as two or more types having different cross-sectional shapes.

The electromagnetic wave transceiver may include an adhesive layer formed of a conductive silicone adhesive between the antenna and the waveguide or between the waveguide and the circuit board.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
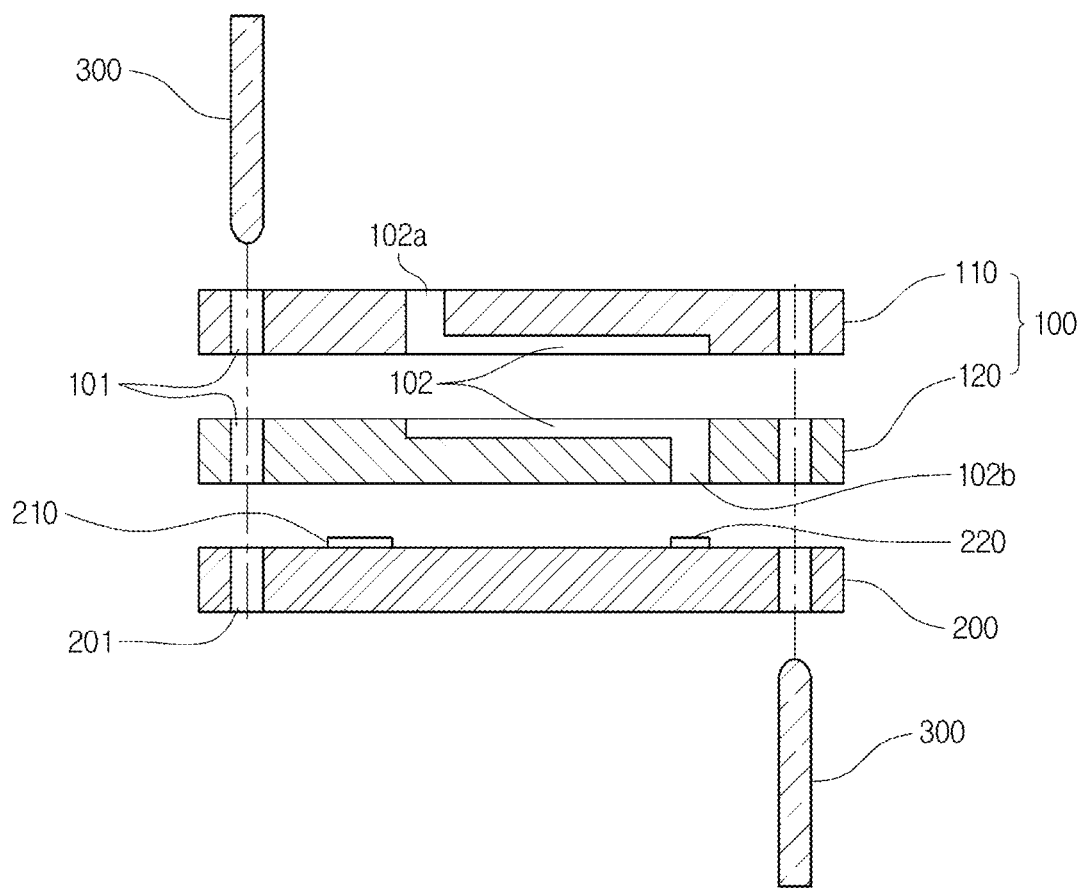
FIG. 1 is a cross-sectional view illustrating an uncoupled state of an electromagnetic wave transceiver according to one embodiment of the present disclosure.

Hereinafter, embodiments of the present disclosure will be described in detail with reference to the accompanying drawings. The following embodiments are to provide the spirit of the present disclosure to those skilled in the art. The present disclosure is not limited to the embodiments disclosed herein and may be implemented in different forms. In the drawings, portions which are not related to the description may be omitted for clarifying the present disclosure, and sizes of components may be exaggerated for facilitating understanding of the present disclosure.

Figure 2:
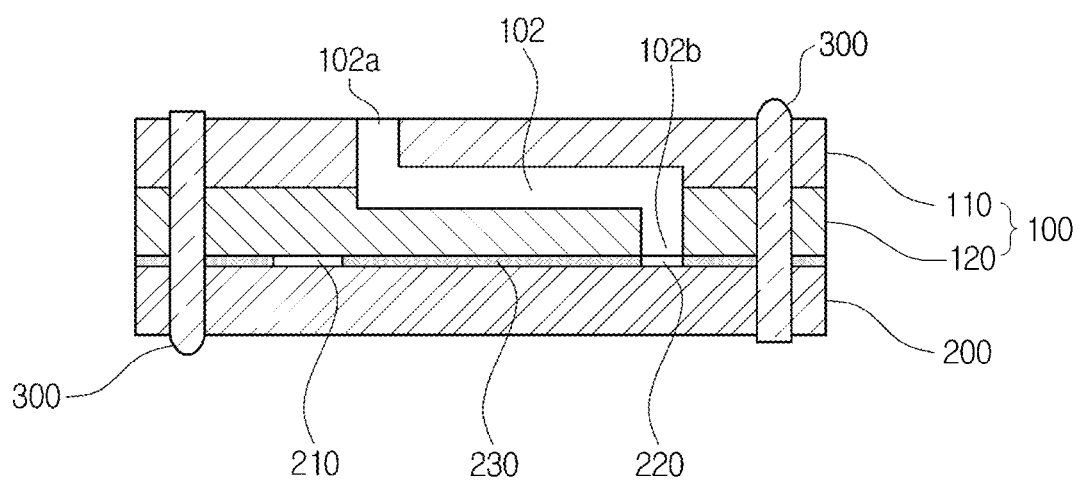
FIG. 2 is a cross-sectional view illustrating a coupled state of the electromagnetic wave transceiver according to one embodiment of the present disclosure.
Figure 3:
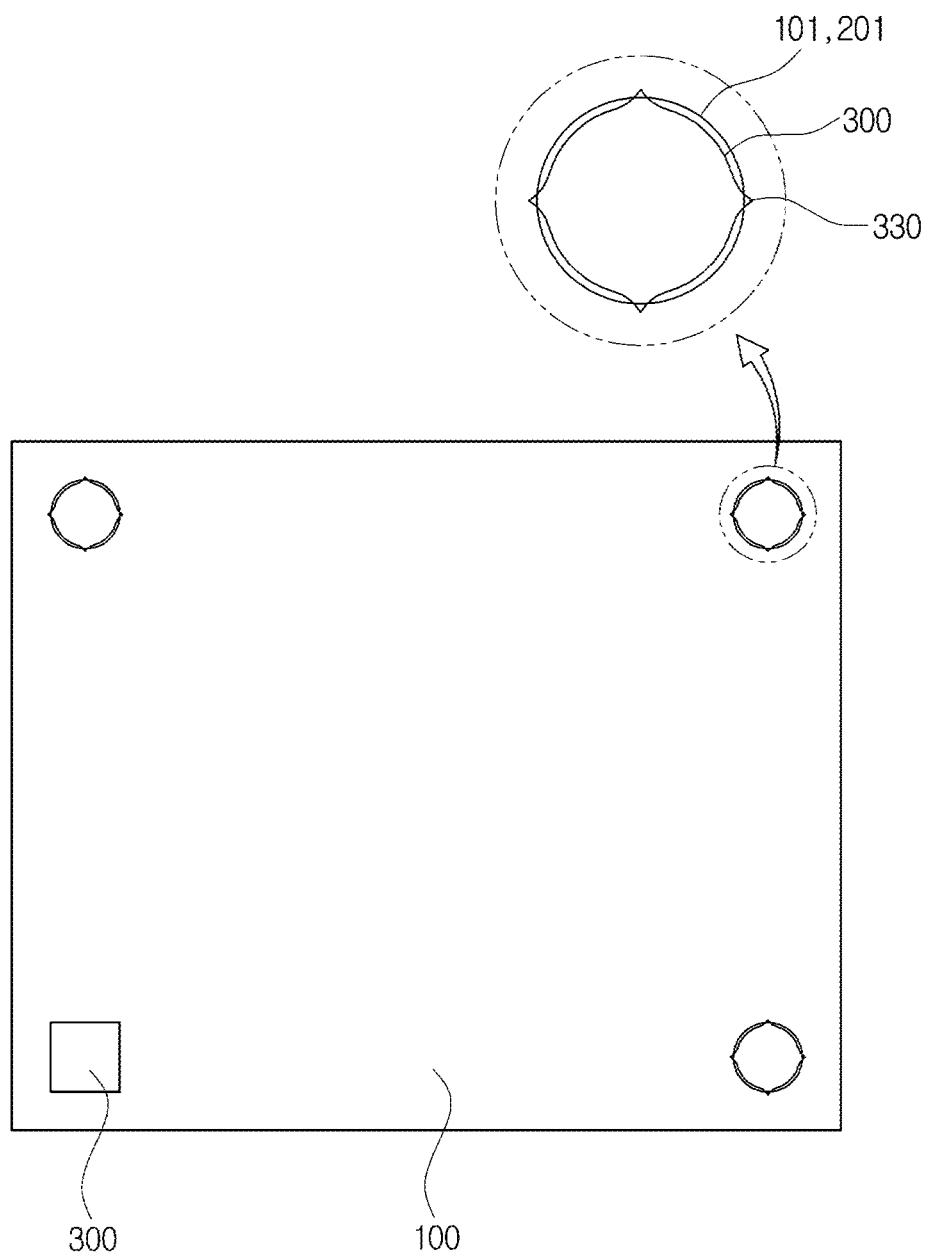
FIG. 3 is a top view illustrating the coupled state of the electromagnetic wave transceiver according to one embodiment of the present disclosure.

FIG. 1 is a cross-sectional view illustrating an uncoupled state of an electromagnetic wave transceiver according to one embodiment of the present disclosure. In addition, FIGS. 2 and 3 are a cross-sectional view and a top view illustrating a coupled state of the electromagnetic wave transceiver according to one embodiment of the present disclosure. In addition, FIGS. 4A, 4B, 4C, and 4D are cross-sectional views illustrating a fastener of the electromagnetic wave transceiver according to one embodiment of the present disclosure. In addition, FIG. 5 is a cross-sectional view illustrating a state in which the electromagnetic wave transceiver is coupled to a housing according to one embodiment of the present disclosure.

Referring to FIGS. 1 to 5, the electromagnetic wave transceiver according to one embodiment of the present disclosure includes a waveguide assembly 100, a circuit board 200 on which the waveguide assembly 100 is stacked, and fasteners 300 which couple the waveguide assembly 100 and the circuit board 200.

More specifically, the waveguide assembly 100 includes assembly fastening holes 101 through which the fasteners 300 pass or into which the fasteners 300 are partially fixedly inserted and a path 102 which connects a first opening 102a having a slot shape and provided in one surface at a side opposite to the circuit board 200 and a second opening 102b having a slot shape and provided in one surface at a side of the circuit board 200. In this case, at least two assembly fastening holes 101 are provided, and at least one path 102 is provided.

In addition, the waveguide assembly 100 includes an antenna 110 provided at the side opposite to the circuit board 200 and a waveguide 120 provided between the antenna 110 and the circuit board 200. In this case, the antenna 110 and the waveguide 120 may be provided in an integrated form in a state in which the antenna 110 and the waveguide 120 are stacked and coupled or in an individual form in a state in which the antenna 110 and the waveguide 120 are separated.

Accordingly, each of the assembly fastening holes 101 may be provided as one hole passing through the waveguide 120 and the antenna 110 or as a groove extending from a lower surface of the waveguide assembly 100 to the waveguide 120 or to a part of the antenna 110. In addition, a cross-sectional shape of the assembly fastening hole 101 is provided the same as or similar to a cross-sectional shape of each of the fasteners 300.

In addition, a part of the path 102 extending from the first opening 102a is provided in the antenna 110, and the rest extending from the second opening 102b is provided in the waveguide 120. In addition, a cross-sectional shape of the path 102 may be provided in one of various shapes including a circular or square shape.

Meanwhile, the antenna 110 is a component for transmitting and receiving electromagnetic waves to and from an external space or external device, an entirety or a part of the antenna 110 is formed of a conductor, and a plate shape of the antenna 110 is illustrated in the drawings, but the present disclosure is not limited thereto, and the antenna 110 may have one of various shapes.

In addition, the waveguide 120 is for a transmission path for minimizing loss of electromagnetic waves transmitted between the antenna 110 and the circuit board 200, and an entirety or at least of a part of the waveguide 120 is formed of a conductor. More specifically, the entire waveguide 120 may be an injection molding part formed of a metal, a plated plastic, or the like, or an injection molding part formed of a plastic having a surface molded as a sheet metal or the like. In addition, the waveguide 120 may be integrally provided or provided by being divided into two or more pieces in a stacking direction.

Meanwhile, the circuit board 200 is a plate formed of an insulating material such as epoxy resin or phenolic resin and includes one or more electronic components 210, a conductor assembly 220, and a pattern or wire connecting the electronic components 210 and the conductor assembly 220 for receiving an electromagnetic wave received from the antenna 110 and processing a signal, or transmitting an electromagnetic wave to the antenna 110. In this case, the waveguide 120 may be connected to the conductor assembly 220 to transmit an electromagnetic wave between the antenna 110 and the circuit board 200.

In addition, the circuit board 200 further includes a board fastening hole 201 which is provided at the same position as the assembly fastening hole 101 when stacked on the waveguide assembly 100. In this case, a cross-sectional shape of the board fastening hole 201 is provided the same as or similar to the cross-sectional shape of the assembly fastening hole 101 and the cross-sectional shape of the fastener 300.

In addition, a cross-sectional area of the board fastening hole 201 may be the same as a cross-sectional area of the assembly fastening hole 101 or may be different therefrom according to an entry direction of the fastener 300. More specifically, when the fastener 300 performs coupling in a direction from the circuit board 200 to the waveguide assembly 100, the cross-sectional area of the board fastening hole 201 may be greater than the cross-sectional area of the assembly fastening hole 101, and when the fastener 300 performs coupling in a direction from the waveguide assembly 100 to the circuit board 200, the cross-sectional area of the board fastening hole 201 may be smaller than the cross-sectional area of the assembly fastening hole 101.

In addition, as illustrated in FIG. 2, an adhesive layer 230 formed by applying a conductive silicone adhesive for planarizing a coupling surface which is ununiform due to height differences between the electronic components 210 and the conductor assembly 220 may be further disposed between the waveguide assembly 100 and the circuit board 200. In addition, the adhesive layer 230 may also be provided between the antenna 110 and the waveguide 120 or between the waveguide 120 provided as a plurality of waveguides 120.

Meanwhile, the fasteners 300 may be a member inserted into the assembly fastening hole 101 and the board fastening hole 201 in an interference fit or transition fit manner to couple the waveguide assembly 100 and the circuit board 200, and the entire fastener 300 may be an injection molding part formed of a metal, a plated plastic, or the like.

In this case, an interference fit is a fit in which an interference is always present between a hole and a shaft, and a transition fit is a fit in which a gap and an interference are present between a hole and a shaft.

Accordingly, in the electromagnetic wave transceiver according to the embodiment, an increase in weight of a product due to the fastener for aligning and fixing the components can be minimized, and an increase in process cost and a decrease in process efficiency can also be minimized.

Figure 4A:
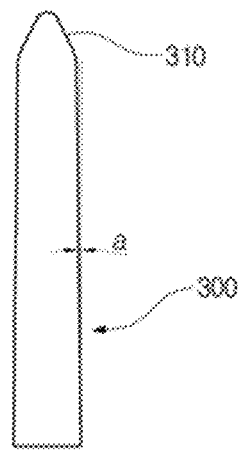
FIGS. 4A, 4B, 4C, and 4D are cross-sectional views illustrating a fastener of the electromagnetic wave transceiver according to one embodiment of the present disclosure.
Figure 5:
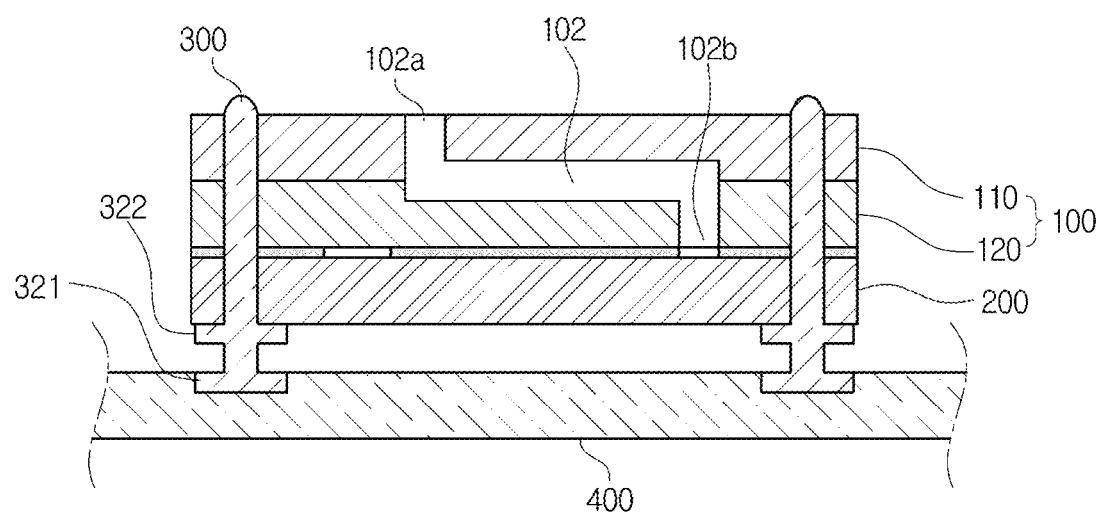
FIG. 5 is a cross-sectional view illustrating a state in which the electromagnetic wave transceiver is coupled to a housing according to one embodiment of the present disclosure.

More specifically, as illustrated in FIG. 4A, the fastener 300 is a pin of which a cross section has a polygonal column shape including a circular or square shape, and an entry portion 310 having a chamfered shape to facilitate entry of the fastener 300 into the assembly fastening hole 101 or the board fastening hole 201 may be provided at one end of the fastener 300. In addition, the fastener 300 may have a tapered shape formed so that a cross-sectional area gradually increases from the entry portion 310 toward the other end. In this case, the taper angle a of the fastener 300 may be in the range of 0 to 10°.

Figure 4B:
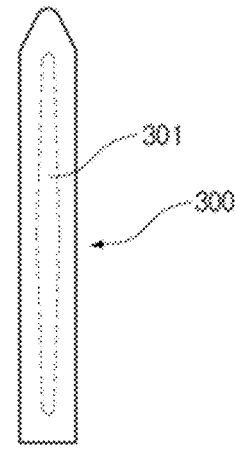

In addition, as illustrated in FIG. 4B, the fastener 300 may include a hollow 301 provided in the fastener 300 so that a repulsive force occurs in a radial direction when inserted into the assembly fastening hole 101 and the board fastening hole 201.

Figure 4C:
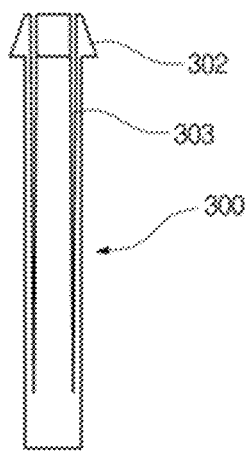

In addition, as illustrated in FIG. 4C, the fastener 300 may include hook portions 302 formed at one end to protrude in the radial direction to prevent separation of the fastener 300 due to a force applied in a direction opposite to an insertion direction of the fastener 300 and cut portions 303 formed to extend from the hook portions 302 so that a repulsive force is generated in the radial direction when inserted into the assembly fastening hole 101 and the board fastening hole 201.

Figure 4D:
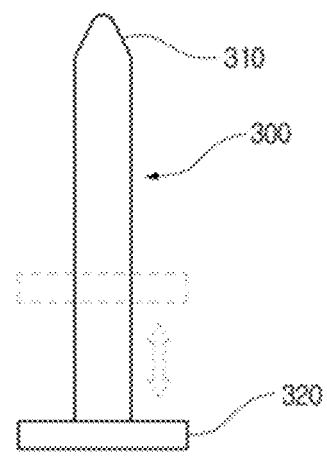

In addition, as illustrated in FIG. 4D, the fastener 300 includes a flange 320 formed to protrude in the radial direction of the fastener 300 at a side opposite to the entry portion 310. In this case, as illustrated in FIG. 5, when the electromagnetic wave transceiver according to one embodiment of the present disclosure includes a housing 400, the flange 320 is a part for adjusting positions of the waveguide assembly 100 and the circuit board 200 with respect to the housing 400 and being insert-injection molded with the housing 400 and may be provided so that a height is adjustable with respect to the entry portion 310. More specifically, the flange 320 may be provided as a plurality of flanges 320 including a first flange 321 fixed to an end portion opposite to the entry portion 310 for being insert-injection molded with the housing 400 and a second flange 322 of which a height is adjustable for adjusting the positions of the waveguide assembly 100 and the circuit board 200.

In this case, a partial cross section of the housing 400 is illustrated in FIG. 5. The housing 400 is for protecting the waveguide assembly 100 and the circuit board 200 and forming an exterior of the electromagnetic wave transceiver according to one embodiment of the present disclosure and may include an injection molding part formed of a plastic or the like and may be formed of one of various materials in one of various shape.

In addition, as illustrated in FIG. 3, the fastener 300 may further include a plurality of modified ribs 330 formed on a circumferential surface to protrude in the radial direction from one end to the other end in a longitudinal direction. In this case, since a shape of each of the modified ribs 330 is changed when the fastener 300 is inserted into the assembly fastening hole 101 and the board fastening hole 201, the fastener 300 may be coupled to the waveguide assembly 100 and the circuit board 200. To this end, a diameter of the fastener 300 excluding the modified rib 330 may be formed smaller than a diameter of the assembly fastening hole 101 and a diameter of the board fastening hole 201.

In addition, as illustrated in FIG. 1, a part of the fastener 300 may perform coupling from the circuit board 200, the rest may perform coupling from the waveguide assembly 100, and the fastener 300 may perform coupling in one direction from the circuit board 200 or the waveguide assembly 100.

Accordingly, in the electromagnetic wave transceiver according to the embodiment, a decrease in space for the components and circuits to be mounted on the circuit board due to a head of the fastener for aligning and fixing the components can be minimized.

In particular, in the electromagnetic wave transceiver according to the embodiment, the reliability of a product can be further improved through accurate and firm fixation between the components even when applied to various products including a radar sensor which is relatively frequently exposed to external forces such as vibrations and impacts.

Figure 6:
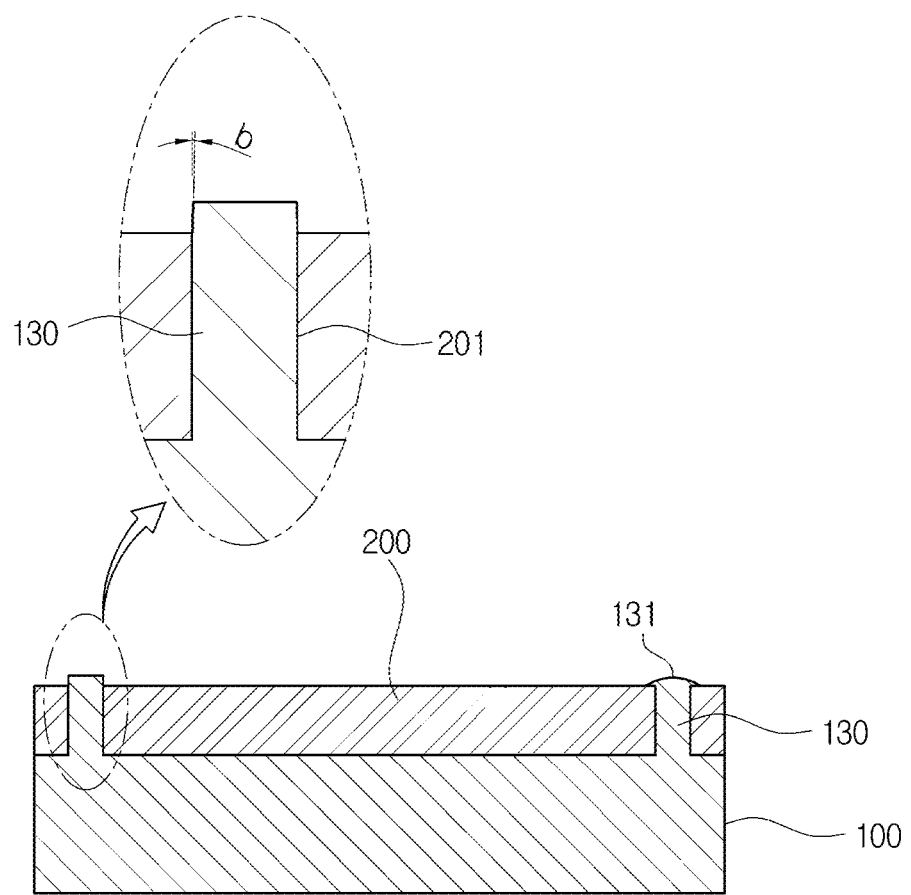
FIG. 6 is a cross-sectional view illustrating a coupled state of an electromagnetic wave transceiver according to another embodiment of the present disclosure.
Figure 7:
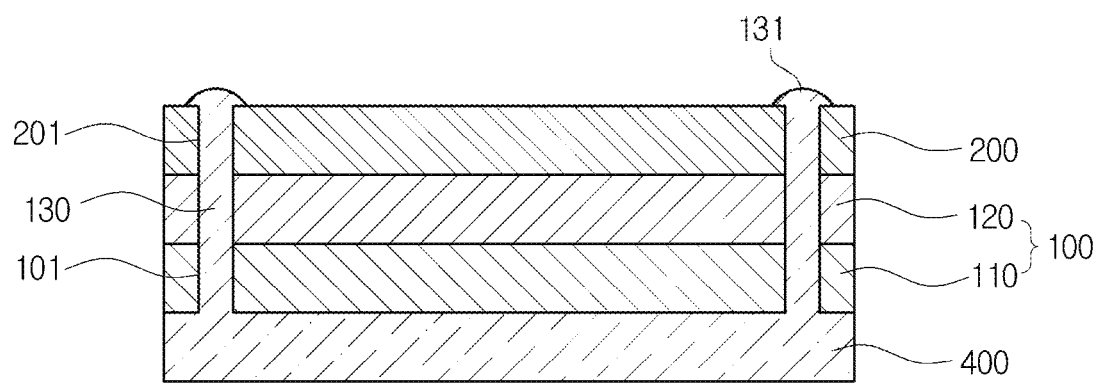
FIG. 7 is a cross-sectional view illustrating a coupled state of an electromagnetic wave transceiver according to still another embodiment of the present disclosure.

Meanwhile, FIGS. 6 and 7 are cross-sectional views illustrating coupled states of electromagnetic wave transceivers according to other embodiments of the present disclosure.

Referring to FIGS. 6 and 7, one of the electromagnetic wave transceivers according to other embodiments of the present disclosure includes a waveguide assembly 100, a circuit board 200 disposed to be stacked on the waveguide assembly 100, and fastening bosses 130 provided on the waveguide assembly 100 or a housing 400 to couple the waveguide assembly 100 and the circuit board 200.

More specifically, each of the fastening bosses 130 is provided on the waveguide assembly 100 to be interference- or transition-fitted into a board fastening hole 201 to couple the waveguide assembly 100 and the circuit board 200. In this case, the fastening boss 130 may be integrally formed with the waveguide assembly 100 or may be provided as a separate member and integrally formed through an insert-injection molding method or the like. In addition, the entire fastening boss 130 may be an injection molding part formed of a metal, a plated plastic, or the like.

As an example, the fastening boss 130 is also be provided by being molded with a surface formed of a sheet metal when the waveguide assembly 100 is an injection molding part formed of a plastic or the like and has a surface formed of a sheet metal.

In addition, the fastening boss 130 is a pin of which a cross section has a polygonal column shape including a circular or square shape, and an end portion of the fastening boss 130 may be provided in a chamfered shape to facilitate entry into the board fastening hole 201. In addition, the fastening boss 130 may have a tapered shape formed so that a cross-sectional area of the fastening boss 130 decreases toward the end portion of the fastening boss 130. In this case, a taper angle b of the fastening boss 130 may be in the range of 0 to 10°.

In addition, the fastening boss 130 may include a fusing portion 131 formed on the end portion protruding to pass through the board fastening hole 201 through a heat fusing method or the like to further improve a fastening force.

Meanwhile, as illustrated in FIG. 7, the fastening boss 130 is provided on the housing 400 and interference- or transition-fitted into the assembly fastening hole 101 and the board fastening hole 201 to couple the waveguide assembly 100 and the circuit board 200. In this case, the fastening boss 130 may be integrally formed with the housing 400 or may be provided as a separate member and integrally formed through an insert-injection molding method or the like. In addition, the fastening boss 130 may also be provided to enter in a direction from the circuit board 200 to protrude toward the waveguide assembly 100.

In addition, the fastening boss 130 may also be provided on an antenna 110 according to the above-described embodiment to couple the waveguide 120 and the circuit board 200. In this case, a plurality of antennas 110 and waveguides 120 may be stacked and formed.

In addition, the fastener 300 according to the above-described embodiment illustrated in FIG. 4 may be partially or entirely applied to the fastening boss 130.

In addition, the same cross-sectional shape of the fastening bosses 130 may be provided for position alignment, but two or more types of the fastening bosses 130 having different cross-sectional shapes may be provided to prevent a misassembly.

Figure 8:
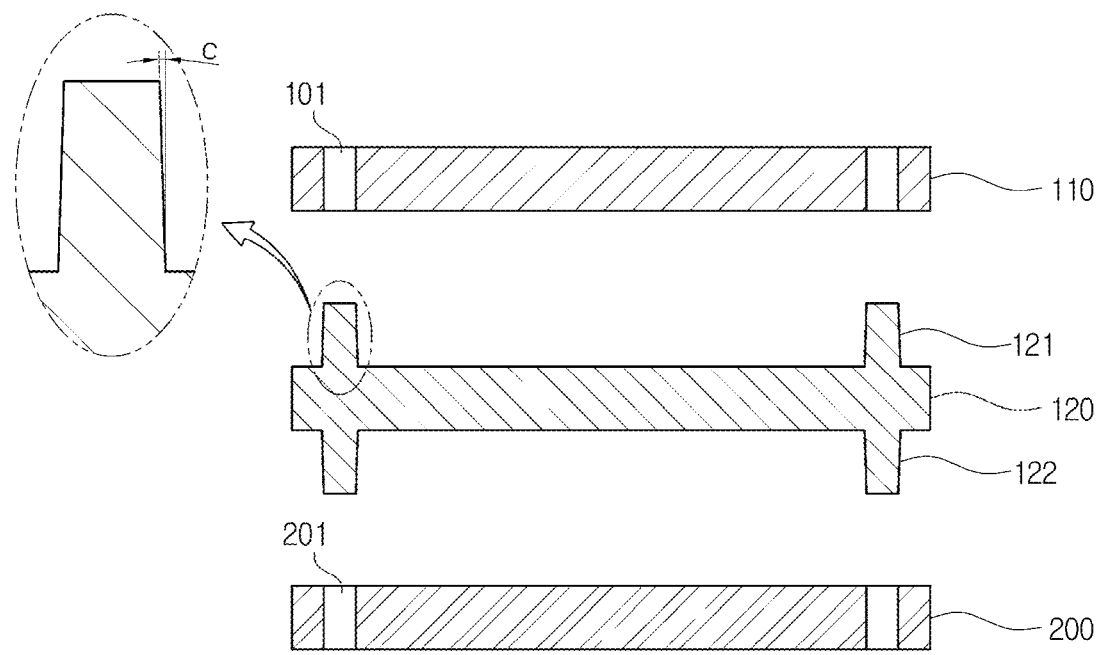
FIG. 8 is a cross-sectional view illustrating an uncoupled state of an electromagnetic wave transceiver according to yet another embodiment of the present disclosure.

FIG. 8 is a cross-sectional view illustrating an uncoupled state of an electromagnetic wave transceiver according to yet another embodiment of the present disclosure. In addition, FIGS. 9 and 10 are a cross-sectional view and a top view illustrating a coupled state of the electromagnetic wave transceiver according to yet another embodiment of the present disclosure.

Figure 9:
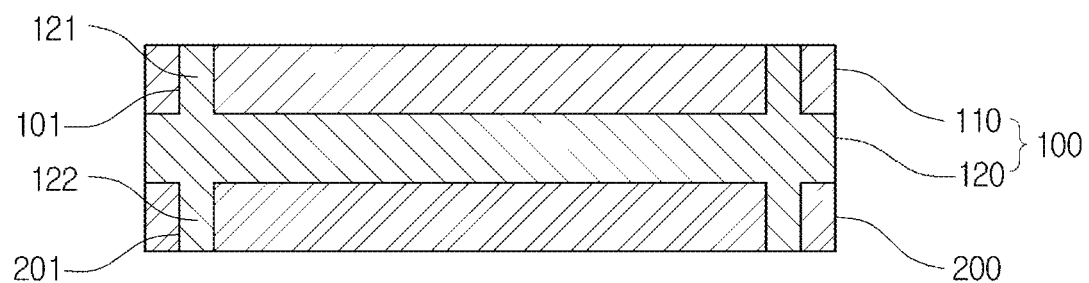
FIG. 9 is a cross-sectional view illustrating a coupled state of the electromagnetic wave transceiver according to yet another embodiment of the present disclosure.
Figure 10:
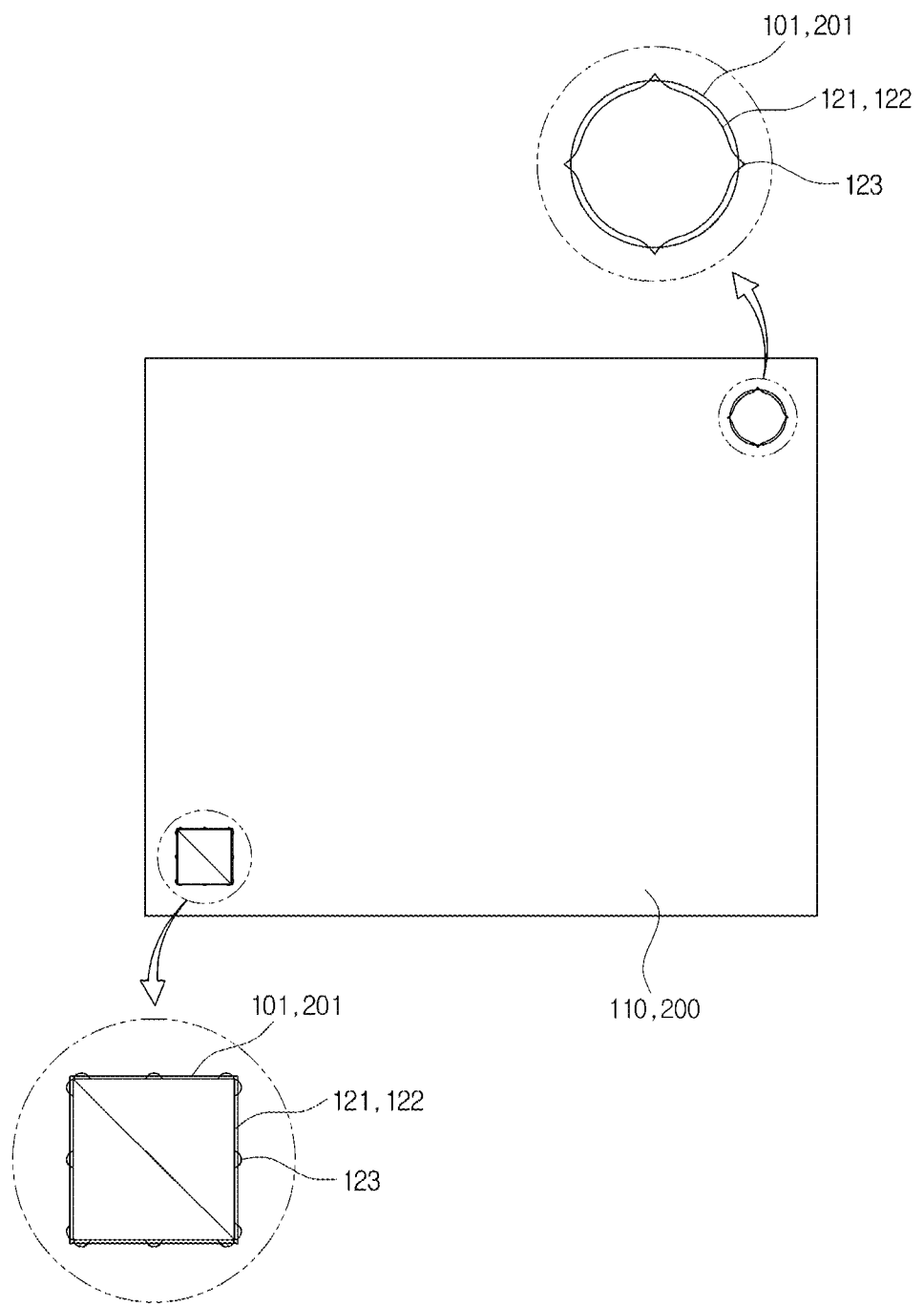
FIG. 10 is a top view illustrating a coupled state of the electromagnetic wave transceiver according to yet another embodiment of the present disclosure.

Referring to FIGS. 8 to 10, the electromagnetic wave transceiver according to yet another embodiment of the present disclosure may further include first fastening parts 121 to which an antenna 110 is coupled and second fastening parts 122 to which a circuit board 200 is coupled, which are formed on one surface and the other surface of a waveguide 120, respectively.

More specifically, the first fastening parts 121 and the second fastening parts 122 are inserted into assembly fastening holes 101 and board fastening holes 201, respectively, to couple a waveguide assembly 100 and the circuit board 200. In this case, each of the first fastening parts 121 and the second fastening parts 122 may be integrally formed with the waveguide 120 like the fastening boss 130 according to the above-described embodiment or provided as separate members and integrally formed through an insert-injection molding method or the like, and an entirety thereof may be an injection molded part formed of a metal, a plated plastic, or the like.

In addition, in each of the first fastening parts 121 and the second fastening parts 122 is a pin of which a cross section has a polygonal column shape including a circular or square shape, and an end portion thereof may be provided to have a chamfered shape to facilitate entry into one of the assembly fastening holes 101 or one of the board fastening holes 201. In this case, a taper angle c of each of the first fastening parts 121 and the second fastening parts 122 may be in the range of 0 to 10°. In addition, specific characteristics of the fastening boss 130 according to the above-described embodiment may be also applied to each of the first fastening parts 121 and the second fastening parts 122

In addition, the same cross-sectional shape of the first fastening part 121 and the second fastening part 122 may also be provided for position alignment, but two or more types of each of the first fastening part 121 and the second fastening part 122 having different cross-sectional shapes may also be provided to prevent a misassembly as illustrated in FIG. 10. In each of the first fastening part 121 and the second fastening part 122, a plurality of protruding ribs 123 protruding in a radial direction may extend in a longitudinal direction, and a diameter of each of the first fastening part 121 and the second fastening part 122 excluding the protruding ribs 123 may be smaller than a diameter of the assembly fastening hole 101 or the board fastening hole 201 so that the first fastening part 121 and the second fastening part 122 are coupled to the assembly fastening hole 101 and the board fastening hole 201, respectively, when the protruding ribs 123 are deformed.

Accordingly, in the electromagnetic wave transceiver according to the embodiment, a misassembly of the stacked waveguide assembly and circuit board can be prevented.

As is apparent from the above description, in an electromagnetic wave transceiver according to an embodiment, an increase in weight of a product due to a fastener for alignment and fixation of components can be minimized.

In an electromagnetic wave transceiver according to an embodiment, an increase in process cost and a decrease in process efficiency due to a fastening process of a fastener for alignment and fixation of components can be minimized.

In an electromagnetic wave transceiver according to an embodiment, a decrease in space for components, circuits, and the like to be mounted on a circuit board due to a head and the like of a fastener for alignment and fixation of the components can be minimized.

In an electromagnetic wave transceiver according to an embodiment, the reliability of a product can be further improved by accurately and firmly fixing components even when the electromagnetic wave transceiver is applied to various products including radar sensors which are relatively frequently exposed to external forces such as vibrations and impacts.

In an electromagnetic wave transceiver according to an embodiment, a misassembly of a waveguide assembly and a circuit board which are disposed to be stacked can be prevented.

What is claimed is:

1. An electromagnetic wave transceiver comprising:
    a waveguide assembly; and
    a circuit board including a board fastening hole and disposed to be stacked on the waveguide assembly,
    wherein the waveguide assembly includes:
        an antenna including an assembly fastening hole; and
        a waveguide including a first fastening part disposed on one surface of the waveguide and interference-fitted or transition-fitted into the assembly fastening hole and a second fastening part disposed on an other surface of the waveguide and interference-fitted or transition-fitted into the board fastening hole, the waveguide disposed between the antenna and the circuit board to be coupled to the antenna and the circuit board.

2. The electromagnetic wave transceiver of claim 1, wherein the first fastening part is provided in a tapered shape of which a cross-sectional area decreases toward an end portion of the first fastening part that enters the assembly fastening hole.

3. The electromagnetic wave transceiver of claim 1, wherein, in each of the first fastening part and the second fastening part:
    a plurality of protruding ribs protruding in a radial direction extend in a longitudinal direction; and
    a diameter of each of the first fastening part and the second fastening part excluding the protruding ribs is smaller than a diameter of the assembly fastening hole or the board fastening hole so that the first fastening part and the second fastening part are coupled to the assembly fastening hole and the board fastening hole, respectively, when the protruding ribs are deformed.

4. The electromagnetic wave transceiver of claim 1, wherein each of the first fastening part and the second fastening part is provided as two or more types having different cross-sectional shapes.

5. The electromagnetic wave transceiver of claim 1, further comprising an adhesive layer formed of a conductive silicone adhesive between the antenna and the waveguide or between the waveguide and the circuit board.

6. The electromagnetic wave transceiver of claim 1, wherein each of the first fastening part and the second fastening part is integrally formed with the waveguide.

7. The electromagnetic wave transceiver of claim 1, wherein each of the first fastening part and the second fastening part is provided as separate members and integrally formed through an insert-injection molding method.

8. The electromagnetic wave transceiver of claim 1, wherein the second fastening part is provided in a tapered shape of which a cross-sectional area decreases toward an end portion of the second fastening part that enters the board fastening hole.

* * * * *